United States Patent [19]

Carter, Jr.

[11] 4,001,600
[45] Jan. 4, 1977

[54] INTERCONNECTING CIRCUIT FOR EBS DIODES AND METHOD

[75] Inventor: Philip S. Carter, Jr., Palo Alto, Calif.

[73] Assignee: Watkins-Johnson Company, Palo Alto, Calif.

[22] Filed: June 2, 1975

[21] Appl. No.: 582,621

[52] U.S. Cl. .............................. 307/149; 313/366; 315/3
[51] Int. Cl.[2] ........................................ H01J 23/16
[58] Field of Search ....... 307/149; 313/366, 65 AB; 315/3, 3.5, 5.25, 5.24

[56] References Cited
UNITED STATES PATENTS

| 3,749,641 | 7/1973 | Bates et al. | 313/366 |
| 3,916,255 | 10/1975 | Crandall | 315/3 |

Primary Examiner—Herman J. Hohauser

[57] ABSTRACT

An electron-bombarded semiconductor (EBS) source including plural EBS diodes connected in series at the fundamental radio frequency operating range delivers power to a load. A single voltage supply is provided and radio frequency isolation means is connected between the series connected diodes and said supply to effectively connect the diodes in parallel with respect to said supply voltage and current.

12 Claims, 10 Drawing Figures

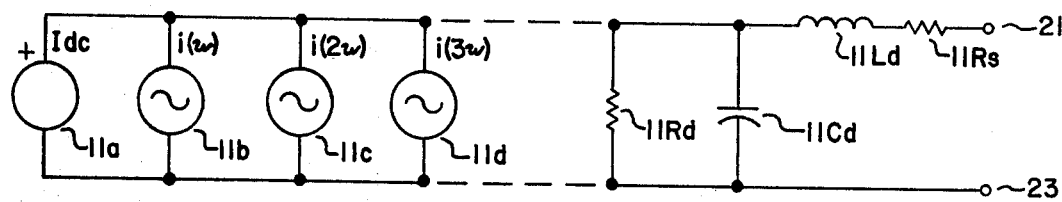
FIG.—1
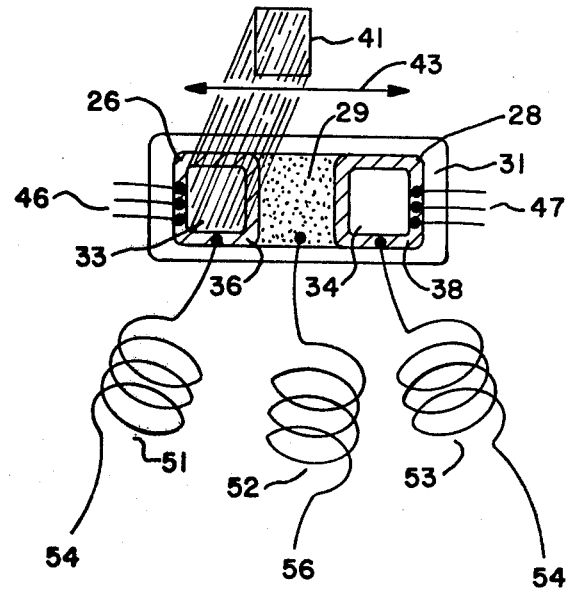
FIG.—2
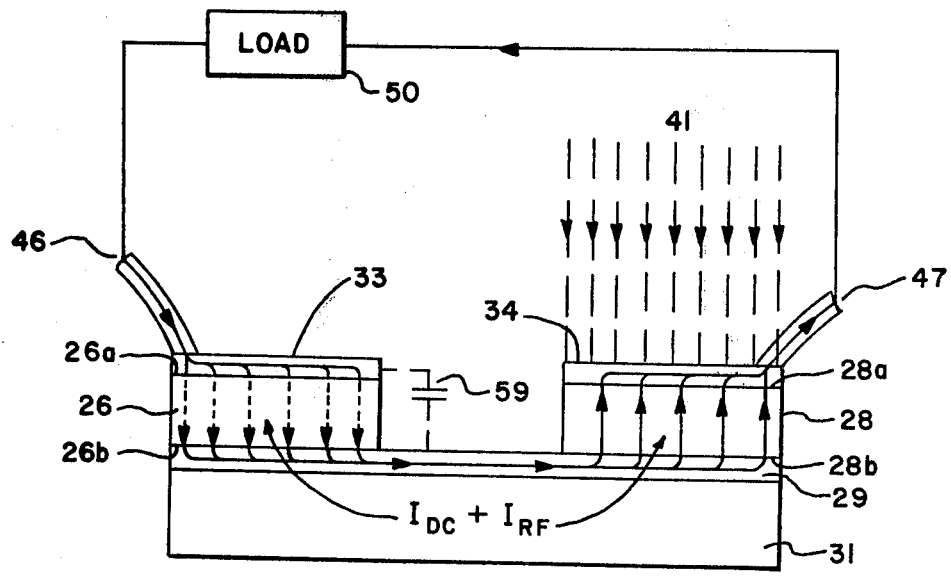
FIG.—3

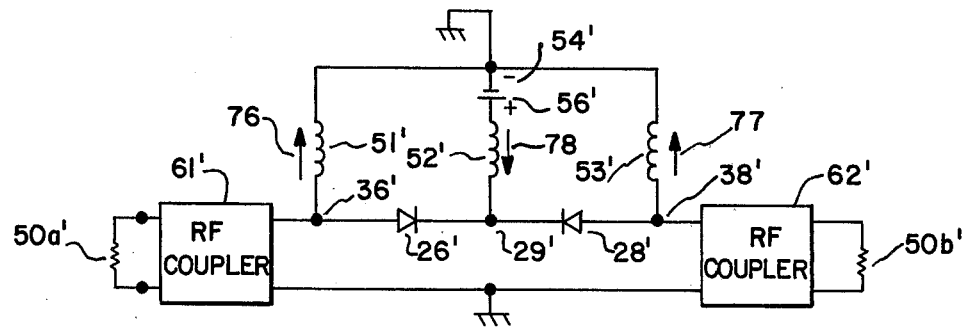
FIG.—4A
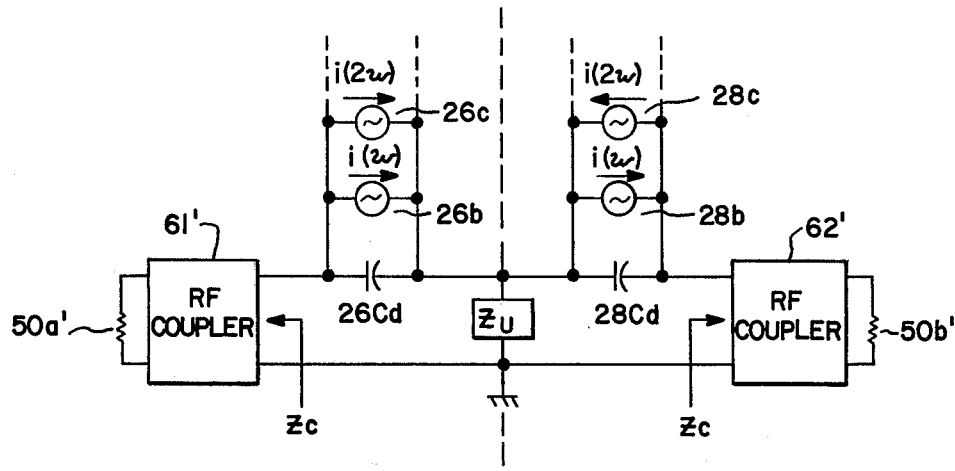
FIG.—4B
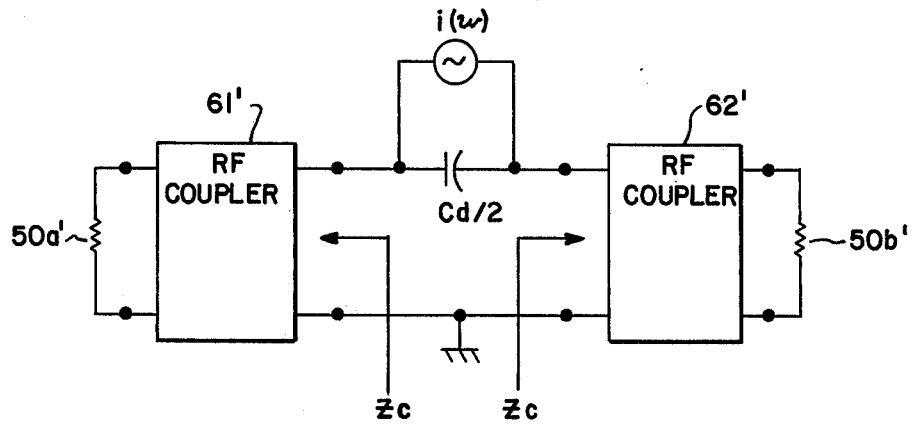
FIG.—5A
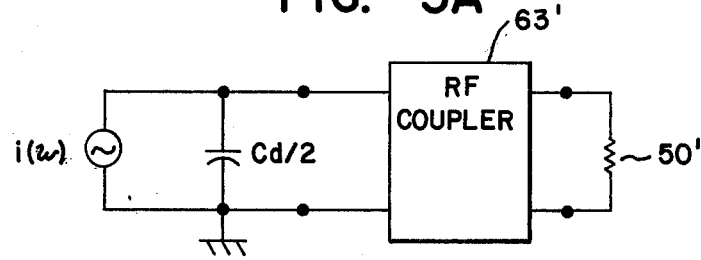
FIG.—5B

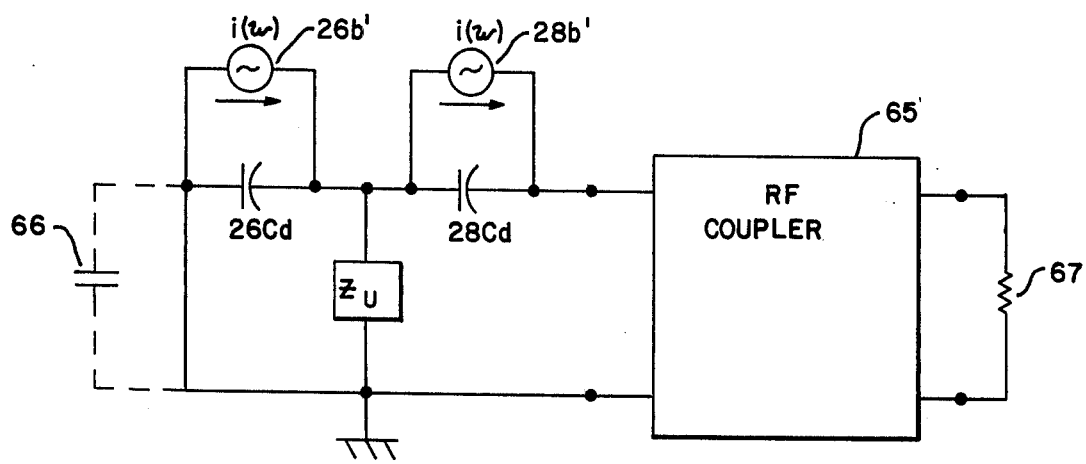
FIG.—6
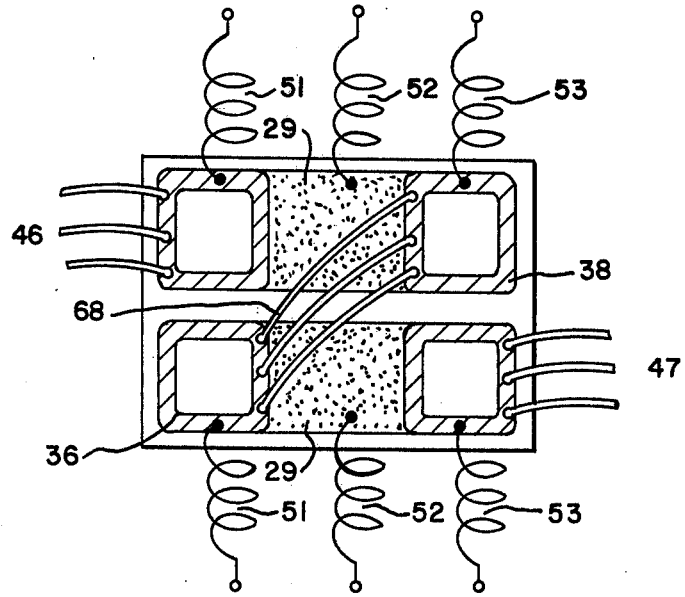
FIG.—7
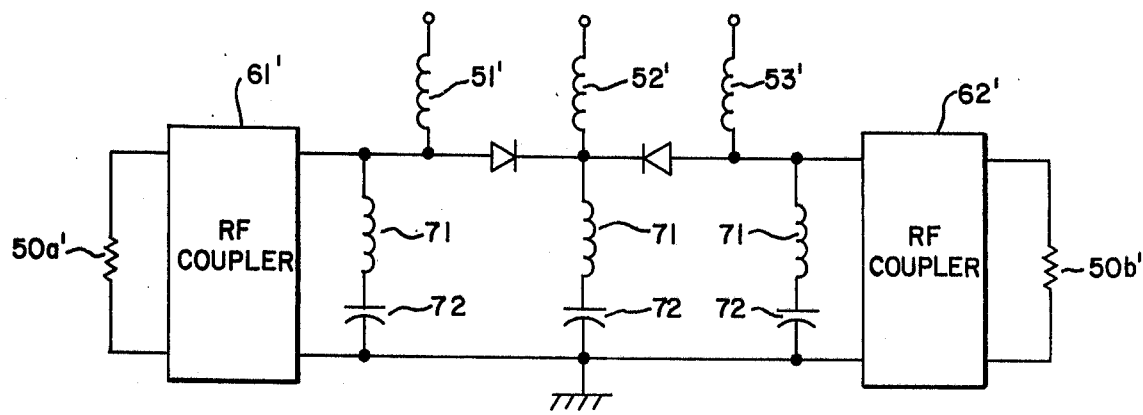
FIG.—8

INTERCONNECTING CIRCUIT FOR EBS DIODES AND METHOD

BACKGROUND OF THE INVENTION

This invention relates generally to a structure for combining the outputs of plural two-terminal radio frequency generating devices. More particularly, this invention relates to a structure for combining the outputs of electron-bombarded semiconductor radio frequency generating devices. More particularly, this invention relates to a structure for combining the outputs of electronbombarded semiconductor radio frequency devices coupled to a load.

Although circuits for combining the outputs of electron-bombarded semiconductor diodes are known in the art they suffer a number of disadvantages. When diodes are paralleled the impedance of output coupling components becomes excessively low as the outputs of an increasing number of diodes are paralleled particularly at higher frequencies. As a result, excessive power losses occur due to fixed stray resistances in the output circuit and the large output coupling transformer ratios which are required to couple to conventional loads. Physically combining plural diodes into one diode having a combined area is not advantageous because the electrical equivalent circuit of the combined area diode remains the same as plural paralleled diodes.

Hybrid combining circuits such as a "Magic-T" or Balun maintain impedance levels when diodes are combined but they have other serious disadvantages. Particularly in broadband operation, the harmonics in the generated signal are loaded by the output circuit thus decreasing the maximum power limitation permissible for a given radio frequency (RF) voltage swing. Further major disadvantages of hybrid circuits are excessive complexity, cost and fabrication difficulty. Thus there is a need for a circuit for combining the outputs of plural EBS diodes in a single EBS source for coupling energy to a load.

OBJECTS AND SUMMARY OF THE INVENTION

Accordingly, it is a general object of the present invention to provide an improved structure for combining the outputs of EBS diodes in an EBS source for coupling energy to a load.

It is a particular object of the present invention to provide an improved structure for series combining the R.F. outputs of plural EBS diodes utilizing a single voltage supply, to form an EBS source.

The foregoing and other objects of the invention are achieved in an EBS source including plural EBS diodes, and a method for series combining their fundamental R.F. outputs. The EBS source couples energy to a load in a radio frequency operating range, utilizing an electron beam to excite beam surfaces of plural EBS diodes capable of assuming first and second states in response to said beam excitation. The EBS source includes an electron beam means for alternately illuminating said diode beam surfaces in a predetermined manner. First and second EBS diodes are arrayed to receive said beam, said diodes being electrically connected in R.F. series. Current flows through each said diode when illuminated. Each non-illuminated diode has a finite capacitance enabling it to carry displacement current. Load coupling means is connected across said series connected diode combination. A voltage supply is provided and insolation means is connected between said diode combination and said supply. Said isolation means is for providing dc supply voltage and dc current to each diode and providing radio frequency isolation between said diodes and said diodes and said supply at said operating frequency range so that when said first diode is illuminated the radio frequency current generated is coupled via the finite capacitance of the second diode to said load and when said second diode is illuminated the radio frequency current generated is coupled via the finite capacitance of the first diode to said load.

DESCRIPTION OF THE DRAWINGS

FIG. 1 is an equivalent output circuit of a fully depleted EBS diode with a sine wave continuous wave (CW) signal input.

FIG. 2 is a top view of first and second EBS diodes connected in series and arrayed to receive an electron beam.

FIG. 3 is a side view of the FIG. 2 structure showing the beam exciting one of said P-N or N-P diodes and the path of RF current through the series connected diodes.

FIG. 4A is a schematic representation of a circuit equivalent of the DC parallel diode connection. FIG. 4B is the equivalent RF series connection of the diode pair.

FIG. 5A shows the equivalent circuit of a balanced, RF series - DC parallel, diode connection. FIG. 5B shows an equivalent circuit of an unbalanced RF series - DC parallel diode connection.

FIG. 6 is an equivalent circuit of series connected diodes connected to a single ended RF coupler for combining the diode outputs across a single load.

FIG. 7 is a top view of a plurality of RF series - DC parallel connected diodes.

FIG. 8 shows an equivalent circuit of RF series - DC parallel connected diodes with additional circuitry for suppressing harmonic frequencies.

DESCRIPTION OF THE PREFERRED EMBODIMENTS

A plurality of interconnecting structures including multiple electron-bombarded semiconductor (EBS) diodes and the corresponding equivalent electrical circuits are shown in the accompanying Figures. Briefly, first and second EBS diodes are series connected at the radio frequency (RF) operating frequency and arrayed to receive an electron beam which illuminates one diode to generate radio frequency energy which is then coupled via the other, nonilluminated, EBS diode to a load. Although RF series connected, the diodes are direct current (D.C.) parallel connected. As will be seen, balanced, unbalanced, plural array and harmonic suppression circuits may be utilized to combine EBS diodes in a single EBS source for coupling energy to a load. Referring to FIG. 1, an electrical equivalent circuit of an EBS diode is shown excited by a continuous wave (CW) input. The EBS diode 11 may be represented as a series of parallel-connected current generators with 11a representing the dc equivalent generator. Generator 11b represents the fundamental radio frequency generating source $i(\omega)$, where $\omega$ is equal to $2\pi f$, and where $f$ is the fundamental frequency of operation. Similarly, current source 11c represents the second harmonic, 11d the third harmonic and so on, to characterize each frequency component. The equivalent impedance is represented by parallel connected resistance $11R_d$ and capacity $11C_d$, in series with inductance $11L_d$ and $11R_s$ which together with the generators represent the equivalent circuit between the active EBS diode terminals 21 and 23.

In the FIG. 1 equivalent circuit, the $I_{dc}$ has been included to show that dc current must be provided through the EBS diode in the RF generating state. This current may be provided via an isolating network, such as an RF choke. In this approximate equivalent circuit the harmonic components $i(2\omega)$ and $i(3\omega)$ are generated because the EBS diode conducts current in only one direction. The transient interruption of current flow when the diode passes in and out of conduction causes the harmonics to be generated. Although both odd and even components of current are indicated in this general equivalent circuit, it has been found that substantially even harmonics of the fundamental frequency are present in the diode output of the circuits to be described. The FIG. 1 circuit has been set forth so that the diode operation may be more fully appreciated in the physical circuits to be discussed. In practice the internal resistance $R_d$ of the current generators $11b$, $11c$–$11n$ is very high, approximately $10^5$ ohms, which may be considered to be infinite compared to the diode reactance, $1/\omega C_d$, the series impedance $R_s + j\omega L_s$ and the load impedance $Z_c$ shown in FIG. 4B. Series reactance $11L_d$ and resistance $11R_s$ include physical contact metallization and metal contact rings at the outer periphery of the diode anode. Resistance $11R_s$ has been found to be quite low, approximately $0.1 - 0.7$ ohms at 1.0 GH$_z$, and $11L_d$ approximates 0.2 nanohenrys in physical diode structures. Of course, because of the low impedance levels at which EBS diode function these unavoidable resistances and reactances may be important and therefore they must be taken into consideration in an EBS circuit for combining the outputs of the individual diodes.

Referring to FIGS. 2 and 3, first and second EBS diodes 26 and 28 are shown arrayed on and carried by conductive substrate 29. Conductive substrate 29 is carried by an insulating support 31, formed of an insulating material such as beryllia or other like material. Referring to FIG. 2, diodes 26 and 28 have top faces 26a and 28a respectively which include beam-sensitive surfaces 33 and 34. Conductive rings 36 and 38 encircle surfaces 33 and 34 and are carried by the top surfaces 26a and 28a of the respective diodes 26 and 28. The conducting rings 36 and 38 provide lead means for connecting the top surface of the diode, in the case of a P-N diode, namely the anode, to external electrical circuitry. The bottom surfaces 26b and 28b of diodes 26 and 28, the cathodes of the diodes, have common lead means in the form of conducting layer or substrate 29 connecting said cathodes. Beam surfaces 33 and 34 are arrayed to receive an electron beam 41 generated by an associated electron gun. Modulation means, such as sinusoidally varying field means, alternately deflects said beam between surface 33 and surface 34 as shown by the arrow 43.

Lead means 46 and 47 are provided to connect the respective rings 36 and 38 to external load coupling means. The load coupling means may directly couple RF series-connected diodes 26 and 28 to a load 50 of a suitable matching impedance, or as will later be seen, load coupling means may include an RF coupler to couple to a conventional 50 ohm load. Isolation means includes chokes 51, 52 and 53, wherein a first end of respective chokes 51 and 53 are connected to rings 36 and 38 and the first end of choke 52 is connected to conductive layer or substrate 29. The second ends of the respective chokes 51, 52 and 53 are connected to a d.c. power supply providing voltage and current of suitable polarity and of sufficient magnitude for alternately back-biasing said diodes when non-illuminated and for radio frequency generation by said diodes when they are illuminated. The second ends of chokes 51 and 53 are connected to a d.c. power supply terminal 54 and the second end of choke 52 connected to the power supply terminal 56. If P-N junction diodes are used the polarity of the power supply is as shown in FIG. 4A. If N-P diodes are used the polarity of the power supply is reversed.

Turning to operation, when the power supply is connected and beam 41 is set in motion, a RF series current is caused to alternately flow through the series connected diodes 26 and 28. Referring to FIG. 3, when diode 28 is illuminated it achieves the radio frequency generating state with current $I_{RF}$ flowing from the cathode to the anode and a corresponding current $I_{RF}$ flows from means 46 through diode 26 via displacement current due to the finite capacity thereacross (shown as equivalent capacitor 59). The current $I_{RF}$ passes via the conductive substrate 29 and generating diode source 28, thereby coupling the energy generated by diode 28 to a load 50. Alternately, when beam 41 illuminates surface 33 of diode 26 the process reverses and radio frequency current flows through load 50 in the opposite direction.

Referring to FIGS. 4A and 4B, the operation of the FIG. 3 physical structure may be appreciated by reference to the respective dc parallel and RF series equivalent circuits shown. For the present analysis it is assumed that the diode circuits may be unequal. The prime references correspond to the corresponding reference of the FIG. 2 and 3 physical structure. Additional load coupling means 61′ and 62′ such as conventional RF couplers have been provided to terminate each of the diodes and divided load portions 50a′ and 50b′ which are connected to the respective means 61′ and 62′. Referring to FIG. 4A it may be seen that dc current 76 flows through diode 26′, and dc current 77 flows through diode 28′. The sum of currents 76 and 77, that is, current 78, flows in choke 52′.

Referring to FIG. 4B, the equivalent RF seriesconnected diodes are shown, the first diode 26 having an equivalent circuit identical to the diodes 11 equivalent circuit previously discussed in conjunction with FIG. 1. Impedance $Z_u$ is the equivalent impedance at the equipotential plane 81 between the first and second diode circuits. This impedance is due to the capacitance to the ground or shield, of the diode plus the diode interconnection. It is normally much higher than the impedance $Z_c$ and the capacitive reactance of the diode, and therefore does not affect the operation of the circuit. The respective diode current generators $26b$, $26c$, $28b$ and $28c$ and capacitances $26C_d$ and $28C_d$ are here assumed to be unequal to thus include unsymmetrical diode arrays, and unsymmetrical beam illumination, as well as dissimilar diodes. It is apparent that the diodes are RF series-connected with respect to the fundamental currents $i(\omega)$ in that the fundamental current generators $26b$ and $28b$ have the same relative phase.

Referring to FIG. 5A, a simplified equivalent circuit is shown for identical generators $26b$ and $28b$ providing a fundamental current $i(\omega)$ and having shunt capacitance $Cd/2$. In order for this equivalent circuit to be valid the diode capacitances 26C*d* and 28C*d* must be equal and the couplers and loads identical. For conventional 50 ohm loads at 50*a'* and 50*b'* each coupler 61' and 62' provides an appropriate impedance transformation.

Referring to FIG. 5B, a singly-terminated circuit is shown. The coupler 63' provides an impedance transformation equivalent to couplers 61' and 62'.

Since the FIG. 5A configuration would require a Magic-T or balun to combine the two 50 ohm outputs, the equivalent shown in FIG. 5B is more desirable. This equivalent circuit can be realized in practice using the circuit shown in FIG. 6. One terminal of generator 26*b'* is RF grounded. The output terminal of generator 28*b'* which is not connected to generator 26*b'* is connected via coupler 65 to a load which may be conventionally 50 ohms. A bypass capacitor 66 is not required but may be added if the proper voltage polarity is not available. The capacitor 66 alternately shown permits bias arrangements in addition to this specific embodiment.

Referring to FIG. 7, a plurality of RF series-connected diodes are shown. First and second structures as previously discussed in conjunction with FIG. 2, may be further series-connected by connecting ring 38 of a first structure to ring 36 of a second, via additional interconnecting means 68. Lead means 47 is then connected to the ring 38 of the second structure. Operation, of course, differs only in that when the diode surfaces are illuminated the four diodes are effectively in RF series. At the same time, the diodes are all connected in dc parallel. The equivalent series capacitance Cd is one fourth that of single diodes and the total circuit inductance includes the interconnection inductance plus four times the inductance of each diode. It is believed that the additional interconnection inductance contributed by lead means 68 will be important in determining the overall bandwidth capability of the total array.

It is further believed that the combined power output and dissipation of the RF series -dc parallel connected diodes should be nearly equal to the number of diodes (N) times the power output of a single diode, provided that appreciable RF losses are not introduced by the physical series connection and the bandwidth remains nearly constant, and the efficiency remains relatively constant.

Efficiency of individual diodes has been found by measurement and calculations to range from 30 to 78.5 percent under various conditions of loading and bias The RF series, dc parallel connection provides similar results degraded only by the previously discussed factors in the interconnections.

Referring to FIG. 8, additional series lowimpedance paths are shown to enhance harmonic currents. The harmonic currents are in phase opposition in this circuit as was noted in FIG. 4B. If the diode impedance is not low and a low impedance path is not provided, the harmonic currents will produce a substantial voltage across the respective diodes to degrade efficiency and thus lower the power output of a given circuit. Series resonant circuits such as an inductance 71 and a capacitance 72 are connected across the respective coupler terminals and from the common diode substrate terminals to the common ground or RF shield terminal to thereby short circuit harmonics and not disturb fundamental frequency and dc currents.

Thus it is apparent that there has been provided an improved structure for combining the outputs of EBS diodes in an EBS source for coupling energy to a load. In particular, an improved structure for series combining the RF outputs of plural EBS diodes utilizing a single voltage supply to form an EBS source is provided.

What is claimed is:

1. An EBS source, for coupling energy to a load at a radio frequency operating range, wherein the source is of the type utilizing an electron beam to illuminate beam surfaces of plural EBS diodes capable of assuming first and second states in response to said excitation comprising electron beam means for alternatively illuminating said diodes in a predetermined manner, first and second EBS diodes arrayed to receive said beams, said diodes being electrically series connected in phase at said operating frequency range, said diodes each having a radio frequency generating state when illuminated and a back-biased state including a finite capacitance thereacross when non-illuminated, load coupling means connected across said series connected diode combination, a power supply, isolation means connected between said diode combination and said supply for providing voltage and current to each diode and providing isolation between said diodes and between said diodes and said supply at said operating frequency range, so that when said first diode is illuminated the radio frequency energy generated is coupled via the finite capacitance of the second diode to said load, and when said second diode is illuminated the radio frequency energy generated is coupled via the finite capacitance of the first diode to said load.

2. An EBS source as in claim 1 wherein said electron beam means is modulated in a predetermined manner.

3. An EBS source as in claim 2 wherein said isolation means includes plural radio frequency chokes, the first and third connected between similar terminals of said respective diodes and one terminal of said supply and a second choke connected to the common terminals of said diodes and the other terminal of said supply.

4. An EBS source as in claim 2 wherein said isolation means includes plural radio frequency chokes, the first and third connected between said respective diode anodes and the negative terminal of the said supply and a second choice choke connected between the series-connected cathode terminals of said devices and the positive terminal of said supply.

5. An EBS source as in claim 2 wherein said isolation means includes plural radio frequency chokes, the first and third connected between said respective diode cathodes and the positive terminal of said supply and a second choke conneced between the series-connected anode terminals of said devices and the negative terminal of said supply.

6. An EBS source as in claim 3 including a plurality of arrayed RF series-connected diodes coupled to a load, each of said diodes having choke isolation means providing a supply voltage and current to said diode and isolating each diode from the remaining diodes and from said power supply.

7. An EBS source as in claim 3 wherein said load coupling means includes directly connecting a properly matched load across said series combination.

8. An EBS source as in claim 3 wherein said load coupling means includes a radio frequency coupler intermediate said series combination and said load.

9. An EBS source as in claim 3 wherein said load coupling means includes a properly-matched single ended radio frequency coupler, coupled to said load, said coupler having RF and ground terminals.

10. An EBS source as in claim 9 wherein said load coupling means includes a properly-matched single ended radio frequency coupler, coupled to said load, said coupler having RF and ground terminals, together with an RF capacitor having a capacity much greater than the diode finite capacity, and having one end thereof connected to said ground terminal and the other end of said capacitor and said RF coupler terminal connected across said series-connected diode combination.

11. An EBS source as in claim 3 together with short circuiting means including plural series harmonic resonant circuits connected between said common series diode connection and RF ground, and an additional circuit connected between each of the remaining terminals of said diodes and RF ground.

12. In a method for simultaneously generating and combining radio frequency energy coupled to a load over a radio frequency operating range, utilizing series connected first and second EBS diodes excited by cyclical illumination of said diodes, said diodes each having a radio frequency generating state when illuminated and a back-biased state including a finite capacity thereacross when non-illuminated, the method comprising, simultaneously illuminating said first EBS diode over a portion of said cycle by said beam and maintaining said second diode isolated from said illumination, thereby coupling said first diode radio frequency energy via said second diode finite capacity to said load, and simultaneously illuminating said second EBS diode over the remaining portion of said cycle by said beam and maintaining said first diode isolating from illumination, thereby coupling said second diode radio frequency energy via first diode finite capacitance to said load.

* * * * *